(12) United States Patent
Kamins et al.

(10) Patent No.: US 7,922,927 B2
(45) Date of Patent: Apr. 12, 2011

(54) METHOD OF FORMING ONE OR MORE NANOPORES FOR ALIGNING MOLECULES FOR MOLECULAR ELECTRONICS

(75) Inventors: Theodore I. Kamins, Palo Alto, CA (US); Yong Chen, Redwood City, CA (US); Patricia A. Beck, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 822 days.

(21) Appl. No.: 11/906,819

(22) Filed: Oct. 3, 2007

(65) Prior Publication Data
US 2008/0203055 A1 Aug. 28, 2008

Related U.S. Application Data

(63) Continuation of application No. 10/029,583, filed on Dec. 20, 2001, now abandoned.

(51) Int. Cl.
*C23F 1/00* (2006.01)
(52) U.S. Cl. .................. 216/75; 216/41; 216/58
(58) Field of Classification Search .......... 216/39, 216/41, 49, 50, 58, 17, 42, 56, 75, 90
See application file for complete search history.

(56) References Cited

U.S. PATENT DOCUMENTS

| 4,407,695 | A | * | 10/1983 | Deckman et al. | 216/42 |
| 5,393,373 | A | * | 2/1995 | Jun et al. | 438/396 |
| 6,010,831 | A | * | 1/2000 | Hatakeyama et al. | 430/323 |
| 6,274,396 | B1 | * | 8/2001 | Funsten | 438/14 |
| 6,379,572 | B1 | * | 4/2002 | Kikuchi et al. | 216/42 |

OTHER PUBLICATIONS

M. Park, "Block Copolymer Lithography, Periodic Arrays of ~10¹ Holes in 1 square Centimeter," *Science*, vol. 276, pp. 1401-1404 (May 30, 1997).

* cited by examiner

*Primary Examiner* — Lan Vinh
(74) *Attorney, Agent, or Firm* — David W. Collins

(57) ABSTRACT

A technique is provided for forming a molecule or an array of molecules having a defined orientation relative to the substrate or for forming a mold for deposition of a material therein. The array of molecules is formed by dispersing them in an array of small, aligned holes (nanopores), or mold, in a substrate. Typically, the material in which the nanopores are formed is insulating. The underlying substrate may be either conducting or insulating. For electronic device applications, the substrate is, in general, electrically conducting and may be exposed at the bottom of the pores so that one end of the molecule in the nanopore makes electrical contact to the substrate. A substrate such as a single-crystal silicon wafer is especially convenient because many of the process steps to form the molecular array can use techniques well developed for semiconductor device and integrated-circuit fabrication.

17 Claims, 1 Drawing Sheet

METHOD OF FORMING ONE OR MORE NANOPORES FOR ALIGNING MOLECULES FOR MOLECULAR ELECTRONICS

CROSS REFERENCE TO PARENT APPLICATION

This patent application claims priority as a continuation application of U.S. patent application Ser. No. 10/029,583 filed Dec. 20, 2001 now abandoned entitled "Method Of Forming One Or More Nanopores For Aligning Molecules For Molecular Electronics," having the same inventors.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA 97201-3-0005 awarded by the Defense Advanced Research Projects Agency.

TECHNICAL FIELD

The present invention is related generally to forming nanopores useful for aligning molecules.

BACKGROUND ART

The field of molecular electronics relies on ordered placement of molecules on a supporting substrate, which is often an electrode of an electronic device. For most applications, the molecules should have a definite orientation or be oriented with respect to the substrate plane, often perpendicular to it. Molecular films are often formed by Langmuir-Blodgett techniques to obtain a uniform monolayer or multi-layer film. However, the orientation of the molecules is often difficult to control using Langmuir-Blodgett techniques until carefully refined for each combination of molecule and substrate and even then may be complicated by domains. A more robust method of aligning the molecules is needed using a technique that is less sensitive to the particular molecule being used. In addition, some applications require molecules to be spaced (separated) from each other; this cannot be readily accomplished by Langmuir-Blodgett techniques.

One approach to providing spaced holes in a substrate (silicon nitride-coated silicon) is disclosed by M. Park et al, "Block Copolymer Lithography: Periodic Arrays of ~$10^{11}$ Holes in 1 Square Centimeter", *Science*, Vol. 276, pp. 1401-1404 (30 May 1997). However, the block copolymer mask is easily ablated during reactive ion etching, thus limiting this approach in the depth of the holes that can be formed. Further, the block copolymers that are used are not commercially available, and must be synthesized for each use, which is inconvenient for use outside the laboratory.

DISCLOSURE OF INVENTION

In accordance with the present invention, a method is provided for forming one molecule or an array of molecules aligned at a defined orientation to the substrate. The method is also useful for forming a mold for deposition of other materials therein and for spacing or separating molecules.

The array of molecules is formed by dispersing them in a small single hole (nanopore) or in an array of small, aligned holes (nanopores) in a substrate. Typically, the material in which the pores are formed is electrically insulating. The underlying substrate may be either electrically conducting or insulating. For electronic device applications, the substrate is, in general, electrically conducting and may be exposed and accessible at the bottom of the pores so that one end of the molecule in the nanopore makes electrical contact to the substrate.

The method for forming a nanopore array for aligning molecules for molecular electronic devices comprises:
   (a) providing a substrate having a first major surface and a second major surface, substantially parallel to the first major surface;
   (b) forming an etch mask on the first major surface, the etch mask comprising one or a plurality of nanoparticles;
   (c) directionally etching the substrate from the first major surface toward the second major surface, using the etch mask to protect underlying portions of the substrate against the etching, thereby forming a plurality of pillars underneath the etch mask;
   (d) forming a layer of insulating material on the surface of the etched substrate, including between the pillars and either partially covering or embedding the pillars; and
   (e) removing the pillars to leave a plurality of nanopores in the insulating layer.

If the pillars are embedded, then between steps (d) and (e), a process step is added to expose the ends of the pillars.

During the directional etching, the substrate may be maintained normal to the etching source to thereby provide nanopores that are substantially perpendicular to the substrate. Alternatively, the substrate and the etching source may be maintained at a pre-selected angle relative to each other to provide nanopores that are in a defined orientation relative to the substrate.

The method of the present invention aligns the molecules in a fixed direction, using a technique that is less sensitive to the particular molecule being used.

BEST MODES FOR CARRYING OUT THE INVENTION

The discussion which follows is primarily directed to forming an array of nanopores. However, it will be appreciated that the same approach can be used to form a single nanopore.

In accordance with the present invention, a technique is provided for forming an array of molecules aligned in a pre-selected defined orientation relative to the substrate. In one embodiment, that orientation is preferably substantially perpendicular. The array of molecules is formed by dispersing them in an array of small, aligned holes (nanopores) in a substrate. Typically, the material in which the pores are formed is electrically insulating. The underlying substrate may be either electrically conducting or insulating. For electronic device applications, the substrate is generally electrically conducting and may be exposed and accessible at the bottom of the pores so that one end of the molecule in the nanopore makes electrical contact to the substrate. A substrate such as a single-crystal silicon wafer is especially convenient because many of the process steps to form the molecular array can use techniques already well developed for integrated-circuit fabrication. For example, heavily doped silicon has sufficient electrical conductivity to serve as one electrode for the molecules. Alternatively, a metal layer can be formed over the silicon or over an oxide on silicon if lower resistivity or electrical isolation is needed.

Figure 1A:
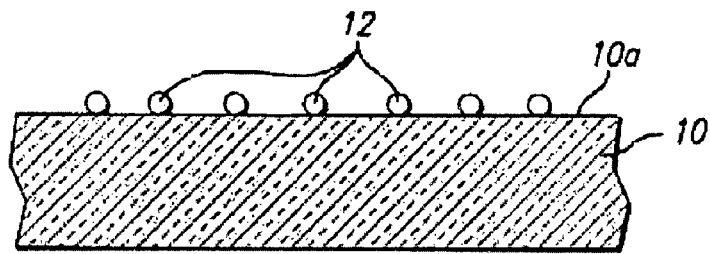
FIGS. 1a-1f are cross-sectional views, illustrating the method steps according to an embodiment of the present invention.

The following steps are used to form the array:

Turning to FIG. 1a, a substrate 10 is shown. The substrate, if insulating, may be an oxide, such as silicon dioxide or aluminum oxide, or a nitride, such as silicon nitride, or an oxynitride, such as silicon oxynitride, or a carbide, such as silicon carbide. If conducting, the substrate may be heavily doped single crystalline or polycrystalline silicon or a metal or a metal layer over silicon or silicon dioxide.

Next, an etch mask of nanoscopic dimensions is applied to the substrate 10, for example, using nanoparticles 12. Nanoparticles of well controlled dimensions are readily available. For example, suspensions containing nanoparticles may be commercially obtained. One such source, Ted Pella, Inc. (Redding, Calif.), provides gold nanoparticles in a sol, with gold particles available in specific sizes ranging from about 2 nm to 250 nm. These nanoparticles are usually composed of an inorganic crystalline core, typically a metal, that is coated with an organic species to keep the nanoparticles from agglomerating. These nanoparticles 12 can be dispersed on the surface 10a of the substrate 10 from the liquid phase. Alternatively, the nanoparticles 12 can be formed by depositing a material of one lattice constant on a substrate having a different lattice constant and using the forces from the lattice mismatch to form nanoparticulate islands of the depositing material. As shown in FIG. 1a, the nanoparticles 12 are distributed on a major surface 10a of the substrate 10 to a coverage less than a single layer. That is, the nanoparticles are separated from each other by a space and there are no multiple layers of the nanoparticles.

Figure 1B:
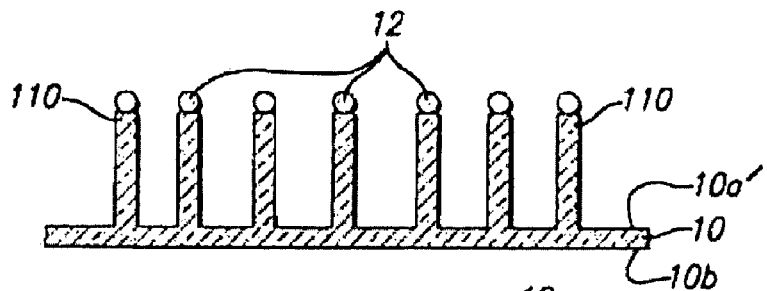

In either case, the nanoparticles 12 are then used as an etch mask, and the substrate 10 is directionally etched, for example using reactive ion etching (RIE) to a controlled depth. The etch chemistry and nanoparticulate material 12 are selected so that the material comprising the substrate 10 is etched much faster than the nanoparticulate material. This etch process produces an array of pillars 110 on the new surface 10a' of the substrate 10. The nanoparticulates 12 may be removed before further processing or may be left on the pillars 110 (and typically removed during subsequent processing). As shown in FIG. 1b, the nanoparticles 12 serve as an etch mask for directional RIE, leaving pillars 110 on an etched surface 12b.

Because the nanoparticles 12 comprise a metallic core, they are better able to withstand the rigors of RIE, and are not readily ablated, as are organic polymers. The ability to survive longer during RIE means that taller pillars, and hence deeper nanopores, can be fabricated.

It will be appreciated that the cross-section of a pillar need not be perfectly uniform over its entire height, but may evidence some taper, as a consequence of the etching process.

The length of the pillars 110 can be tailored to have a specific relation to the length of the molecules to be inserted in the formed nanopores. The remaining thickness of the substrate 10 (the distance between back surface 10b and the new front surface 10a') must be sufficient to provide suitable mechanical strength to the substrate 10.

Next, the array of pillars 110 must be transformed into a corresponding array of holes 16, in which the molecules 18 can be placed. This is accomplished in the following manner: An insulating material 14 is formed on the surface 10a' of the substrate 10, surrounding and covering the pillars 110. Examples of suitable insulating materials include oxides, such as silicon dioxide and aluminum oxide, nitrides, such as silicon nitride, oxynitrides, such as silicon oxynitride, carbides, such as silicon carbide, and diamond-like carbon (DLC). Silicon dioxide may be formed by any number of well known techniques, including, but not limited to, thermal deposition and spin-on-glass (SOG). Thin aluminum oxide, for example, on the order of 12 to 25 Å thick, is formed by totally reacting aluminum in oxygen during deposition or depositing Al and oxidizing afterwards. Still further examples of suitable insulating materials include polymers that have the requisite chemical and electrical properties, i.e., a slower differential etch rate than the pillars 110 and electrically insulating attributes. Such insulating polymers are well known; an example includes polyfluoroalkylenes, which may be produced in a carbon-hydrogen-fluorine plasma.

Figure 1C:
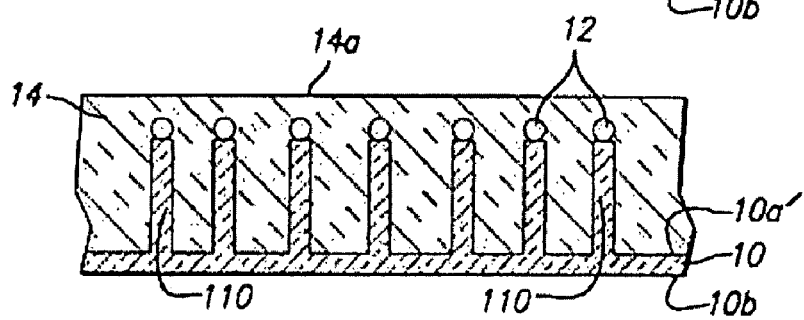

The insulating material 14 may be formed by chemical vapor deposition or by liquid-phase techniques commonly used in semiconductor device processing. Good filling of the space between the pillars 110 is critical. The surrounding material 14 will typically extend above the top of the pillars 110 so that the pillars are completely covered, but this is not essential. Depending on the subsequent processing, a resultant flat (planar) top surface 14a may or may not be important. As shown in FIG. 1c, a layer 14 of an oxide, e.g., silicon dioxide ($SiO_2$), is blanket-deposited, employing well-known deposition techniques, to completely or partially cover the pillars 110. Examples of suitable deposition methods include chemical vapor deposition (CVD) (e.g., high density plasma CVD or thermal CVD or ozone-assisted CVD or plasma-enhanced CVD) and spin-coating, all of which are well-known in the art of semiconductor device fabrication.

Figure 1D:
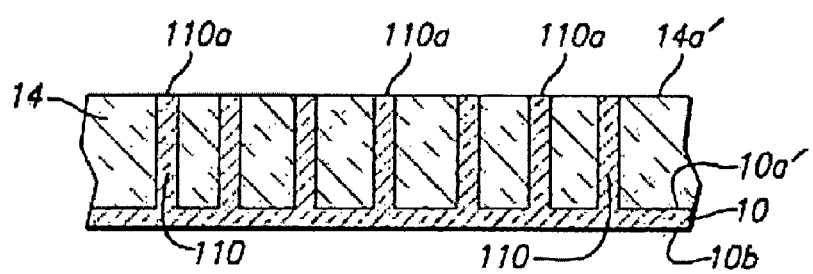

If the pillars 110 are not already exposed, the insulating material 14 surrounding and covering the pillars is then reduced in thickness so that the tops 110a of the pillars are exposed. This material removal may be accomplished by chemical-mechanical polishing (CMP), a technique commonly used in integrated-circuit fabrication. In this case, having a flat top surface 14a before polishing is not critical. At the end of this step, the surface 14a' is flat; the surface is composed of both the exposed ends of the pillars 110a and the surrounding insulating material 14. FIG. 1d shows the resulting structure after polishing, leaving a flat surface 14a' in the insulating layer 14.

Alternatively, the material removal may be accomplished by an unmasked single- or multi-step plasma/reactive-ion etch technique. In this case, the top surface 14a must be flat before the start of the etch process. The selectivity of the plasma/reactive-ion etch can be adjusted during different portions of the etch process to produce either a flat surface 14a' (same etch rate) or a surface with the ends 110a of the pillars 110 either recessed or protruding (different etch rates), as desired. Both CMP and plasma/reactive-ion etching are processes well known in integrated-circuit processing.

If the layer 14 is deposited in such a manner as to form thinner regions over the pillars 110, then the un-masked etch step above does not require that the top surface 14a be flat, as the etching will expose the top of the pillar 110 before the surrounding area is exposed.

Figure 1E:
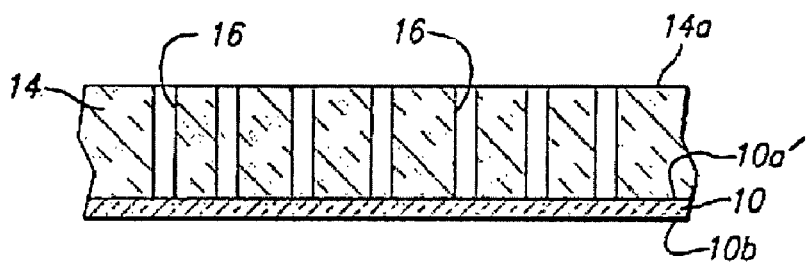

As the final step, the pillars 110 are removed, leaving nanopores 16 extending a specified distance into (or beyond) the insulating material 14, by employing a selective etch. Because of their extremely small size, the pillars 110 are best removed by gas-phase etching. For example, a selective chemical or plasma etch can remove the pillar material 110 without significantly attacking the surrounding insulating material 14. If a plasma is used, its composition is selected to be chemically selective, rather than relying on high-energy/high-density ion bombardment. FIG. 1e shows the resulting structure, after etching away the pillars 110, leaving nanopores 16 where the pillars were originally located.

The nanopores 16 are intended, at least in some applications, to be approximately the size of molecules that are to be placed in them. For example, many long-chain molecules are about 10 nm long and about 1 nm in diameter. The size (diameter) of the nanopores 16, of course, depends on the size of the pillars 110. Broadly, however, the nanopores 16 may be formed having a length within the range of about 5 to 100 nm and a diameter within the range of about 1 to 10 nm. It is expected that the aspect ratio (length:diameter) is likely to be less than about 100:1 and, for practical considerations, less than about 25:1.

Figure 1F:
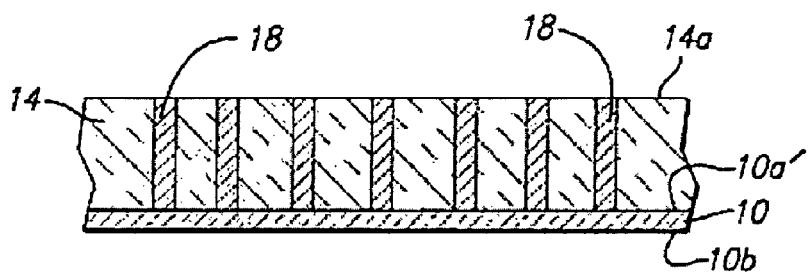

At this point, the array of nanopores 16 is essentially complete. The molecules 18 can then be dispersed over the surface. Many of the molecules fill the nanopores 16 and become aligned preferentially in the direction of the nanopores. The degree of alignment depends on the relative diameters and lengths of the nanopores 16 and molecules 18. FIG. 1f illustrates the filling of the nanopores 16 with molecules or other material 18.

By proper processing techniques before applying the molecules 18, the bottom of the nanopores 16 may be made electrically conducting, either by separate deposition of an electrically-conducting film as a buried layer in the substrate 10 or by use of an electrically conductive substrate 10. Alternatively, the bottom of the nanopores 16 may be covered by a thin tunnel barrier so that a controlled electrical connection between the molecules and the underlying substrate can be made for advantageous use of the molecules in an electronic device. In other cases, a thick insulator may remain if the molecule needs to be electrically isolated.

The array of nanopores 16 that is formed can find a variety of uses. For example, it may be desirable to characterize a molecule. Such nanopores 16 can isolate individual molecules from each other and permit probing, such as by scanning tunneling microscopy (STM). Alternatively, it may be desirable to form molecular electronic devices. The nanopores 16 not only isolate, or separate, the individual molecules from each other, but, in the case of long-chain molecules, prevent bending or kinking of the molecules.

Molecular electronic devices may employ molecules that are capable of switching in the presence of an electric field. Examples of such molecules include the rotaxanes, pseudo-rotaxanes, catenanes, and spiropyrans. For such devices, the substrate 10 forms one electrode, and it is easily within the ability of one skilled in this art, based on the teachings that are emerging, to form a suitable second electrode for applying the electric field.

Filling the nanopores 16 with a material 18 such as a semiconductor or a magnetic material can be used to produce electronic or magnetic devices. The nanopores can be filled by a selective chemical vapor deposition process or possibly by electrochemical deposition. In either case, the nanopore is filled from the bottom toward the top. More conventional processes that nucleate material on the walls of the pore will be difficult to implement because of the small diameter and high aspect ratio of the nanopores 16.

The foregoing discussion is directed primarily to the preferred orientation of the nanopores 16 relative to the substrate 10, namely, substantially perpendicular. Other orientations may also be obtained, less than 90 degrees, such as by changing the angle of the etch source to the substrate or tilting the substrate during directional etching.

INDUSTRIAL APPLICABILITY

The method of forming a nanopore array is expected to find use in the fabrication of molecular electronic devices and for the physical and electrical characterization of molecules.

What is claimed is:

1. A method for forming molecular electronic devices, comprising:
   (a) providing an electrically conducting substrate having a first major surface and a second major surface, substantially parallel to said first major surface;
   (b) forming an etch mask on said first major surface, said etch mask comprising at least one nanoparticle;
   (c) directionally etching said electrically conducting substrate from said first major surface toward said second major surface, using said etch mask to protect underlying portions of said electrically conducting substrate against said etching, thereby forming at least one pillar underneath said etch mask and forming a new surface of the electrically conducting substrate upon which the at least one pillar is formed;
   (d) forming a layer of insulating material on said etched electrically conducting substrate, including around said at least one pillar and at least partially covering said at least one pillar;
   (e) removing said at least one pillar to leave at least one nanopore in said insulating layer and to expose portions of the new surface of the electrically conducting substrate; and
   (f) dispersing electrically switchable molecules in said at least one nanopore.

2. The method of claim 1 wherein:
   in step (b), said etch mask comprises a plurality of said nanoparticles;
   in step (c), a plurality of said pillars is formed by said directional etching;
   in step (d), said layer of insulating material is formed between said pillars and at least partially covering said pillars; and
   in step (e), said plurality of pillars is removed to leave said array of nanopores.

3. The method of claim 1 wherein said at least one nanoparticle has an average particle size within a range of about 1 to 10 nm.

4. The method of claim 1 wherein said at least one nanoparticle comprises an inorganic crystalline core covered with an organic layer.

5. The method of claim 1 wherein said at least one nanoparticle is formed by depositing a material of a first lattice constant on said substrate wherein said substrate has a second and different lattice constant to create a lattice mismatch and using forces from said lattice mismatch to form at least one nanoparticulate island of said deposited material.

6. The method of claim 1 wherein said directional etching is carried out using reactive ion etching.

7. The method of claim 1 wherein said etch mask comprising said at least one nanoparticle is removed prior to forming said insulating material.

8. The method of claim 1 wherein said at least one pillar is removed by selective etching.

9. The method of claim 1 wherein said substrate comprises doped single crystal silicon or a doped polycrystalline silicon layer.

10. The method of claim 1 wherein in step (d), said layer of said insulating material is formed to completely cover said at least one pillar and following step (d), said layer of insulating material is reduced in thickness to expose a top of said at least one pillar.

11. The method of claim 10 wherein said layer of insulating material is reduced in thickness by chemical-mechanical polishing or by an unmasked single-step or multi-step plasma/reactive-ion etch technique.

12. The method of claim 1 wherein said at least one nanopore has a length of about 5 to 100 nm and a diameter of about 1 to 10 nm.

13. The method of claim 12 wherein said at least one nanopore has a length of about 10 nm and a diameter of about 1 nm.

14. The method of claim 1 wherein said insulating material is selected from the group consisting of oxides, nitrides, oxynitrides, diamond-like carbon, and insulating polymers.

15. The method of claim 14 wherein said insulating material is selected from the group consisting of silicon dioxide, aluminum oxide, silicon nitride, and silicon oxynitride.

16. The method of claim 14 wherein said insulating material is formed by chemical vapor deposition or by liquid-phase techniques.

17. A method for forming a molecular electronic device including a first electrode; a layer of an insulating material established on said first electrode; at least one nanopore formed in said layer of insulating material, said at least one nanopore extending through a thickness of the insulating material and to a new surface of said first electrode; electrically switchable molecules dispersed in said at least one nanopore; and a second electrode operatively positioned to create an electric field with the first electrode in the presence of the electrically switchable molecules; said method for forming comprising:

provlding said first electrode having a first major surface and a second major surface, substantially parallel to said first major surface;

forming an etch mask on said first major surface, said etch mask comprising at least one nanoparticle;

directionally etching said first electrode from said first major surface toward said second major surface, using said etch mask to protect underlying portions of said first electrode against said etching, thereby forming at least one pillar underneath said etch mask and forming the new surface of the first electrode;

forming said layer of insulating material on said etched first electrode, including around said at least one pillar and at least partially covering said at least one pillar;

removing said at least one pillar to leave said at least one nanopore in said insulating layer and to expose portions of the new surface of the first electrode;

dispersing said electrically switchable molecules in said at least one nanopore and in contact with the exposed portions of the new surface of the first electrode; and operatively positioning said second electrode.

* * * * *